(12) United States Patent
Frencken et al.

(10) Patent No.: US 9,377,697 B2
(45) Date of Patent: Jun. 28, 2016

(54) LITHOGRAPHIC APPARATUS AND TABLE FOR USE IN SUCH AN APPARATUS

(71) Applicant: ASML Netherlands B.V., Veldhoven (NL)

(72) Inventors: Mark Johannes Hermanus Frencken, Ittervoort (NL); Andre Bernardus Jeunink, Bergeyk (NL); Frederikus Johannes Maria De Vreede, Valkenswaard (NL); Gijs Kramer, Nijmegen (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/648,620

(22) PCT Filed: Dec. 20, 2013

(86) PCT No.: PCT/EP2013/077561
§ 371 (c)(1),
(2) Date: May 29, 2015

(87) PCT Pub. No.: WO2014/096299
PCT Pub. Date: Jun. 26, 2014

(65) Prior Publication Data
US 2015/0309419 A1 Oct. 29, 2015

Related U.S. Application Data

(60) Provisional application No. 61/740,357, filed on Dec. 20, 2012.

(51) Int. Cl.
*G03B 27/52* (2006.01)
*G03B 27/42* (2006.01)
*G03F 7/20* (2006.01)

(52) U.S. Cl.
CPC ........ *G03F 7/70341* (2013.01); *G03F 7/70733* (2013.01)

(58) Field of Classification Search
CPC .................. G03F 7/70341; G03F 7/70733

USPC .................................................. 355/30, 53, 72
See application file for complete search history.

(56) References Cited

U.S. PATENT DOCUMENTS 6,952,253 B2 10/2005 Lof et al.
7,310,132 B2 12/2007 Van Der Schoot et al.
(Continued)

FOREIGN PATENT DOCUMENTS

EP    1 420 298    5/2004
EP    1 713 113    10/2006
(Continued)

OTHER PUBLICATIONS

International Search Report and Written Opinion mailed Jun. 2, 2014 in corresponding International Patent Application No. PCT/EP2013/077561.

*Primary Examiner* — Hung Henry Nguyen
(74) *Attorney, Agent, or Firm* — Pillsbury Winthrop Shaw Pittman LLP (57) ABSTRACT

An immersion lithographic apparatus includes a projection system, a first table with a first planar surface and a second table with a second planar surface, the first and second planar surfaces being substantially coplanar, a liquid confinement system configured to spatially confine an immersion liquid to a volume with a first surface area that is coplanar with the first and second planar surfaces, and is substantially smaller than a second surface area of the top surface of the substrate, and a swap bridge member attached to the first table, the swap bridge member having an upper surface that is substantially coplanar with the first and second planar surfaces, wherein the upper surface of the swap bridge member is configured to serve as part of the liquid confinement system and to deform when the swap bridge member collides with the second table and to remain attached to the first table.

11 Claims, 7 Drawing Sheets

(56) References Cited

U.S. PATENT DOCUMENTS

| | | | |
|---|---|---|---|
| 7,701,550 B2 | 4/2010 | Kemper et al. | |
| 7,706,962 B2 | 4/2010 | Kemper et al. | |
| 8,189,174 B2 * | 5/2012 | Kruizinga | G03F 7/70341 355/53 |
| 8,351,018 B2 | 1/2013 | Direcks et al. | |
| 8,421,993 B2 | 4/2013 | Direcks et al. | |
| 8,547,523 B2 | 10/2013 | Riepen et al. | |
| 8,599,356 B2 * | 12/2013 | Kaneko | G03F 7/70341 355/30 |
| 8,634,053 B2 | 1/2014 | Riepen et al. | |
| 8,836,912 B2 | 9/2014 | Bessems et al. | |
| 2004/0207824 A1 | 10/2004 | Lof et al. | |
| 2006/0038968 A1 | 2/2006 | Kemper et al. | |
| 2006/0158627 A1 | 7/2006 | Kemper et al. | |
| 2007/0216881 A1 * | 9/2007 | Van Der Schoot | G03B 27/42 355/53 |
| 2008/0212046 A1 | 9/2008 | Riepen et al. | |
| 2009/0279060 A1 | 11/2009 | Direcks et al. | |
| 2009/0279062 A1 | 11/2009 | Direcks et al. | |
| 2010/0128241 A1 | 5/2010 | Kruizinga et al. | |
| 2011/0025998 A1 * | 2/2011 | Shibazaki | G03F 7/70341 355/30 |
| 2011/0096305 A1 | 4/2011 | Kaneko et al. | |

FOREIGN PATENT DOCUMENTS

| | | |
|---|---|---|
| EP | 1 840 943 | 10/2007 |
| EP | 2 189 849 | 5/2010 |
| JP | 2008-124219 | 5/2008 |
| WO | 99/49504 | 9/1999 |

* cited by examiner

LITHOGRAPHIC APPARATUS AND TABLE FOR USE IN SUCH AN APPARATUS

CROSS REFERENCE TO RELATED APPLICATIONS

This application is the U.S. National Stage of PCT/EP2013/077561, filed Dec. 20, 2013, which in turn claims priority to U.S. Provisional Application Ser. No. 61/740,357, filed Dec. 20, 2012, the entire contents of all applications are incorporated herein by reference in their entireties.

FIELD OF THE INVENTION

The present invention relates to an immersion lithographic apparatus and to a table for use in such an immersion lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

An embodiment of a lithographic apparatus may exploit a liquid supply system to provide liquid (i.e., an immersion liquid) on a localized area of the substrate and in between a final element of the projection system of the lithographic projection apparatus and the substrate. The liquid supply system has a liquid confinement system so as to confine the liquid between the final element of the projection system and the substrate, the substrate generally having a larger surface area than the final element of the projection system. The liquid is, e.g., distilled water. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid than in air. The effect of the liquid may also be regarded as increasing the effective numerical aperture (NA) of the projection system and also increasing the depth of focus. Other immersion liquids have been proposed, including water with solid particles (e.g., quartz) suspended therein, or a liquid with a nano-particle suspension (e.g., particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

A lithographic apparatus may comprise one or more tables (also referred to as stages). For example, the lithographic apparatus comprises a first substrate table for accommodating a first substrate, and a second substrate table for accommodating a second substrate. The first substrate on the first substrate table is being subjected to an exposure (or: imaging) operation via the projection system, while the second substrate on the second substrate table is being subjected to a measuring operation prior to being subjected to the exposure operation. As another example, the lithographic apparatus comprises a first table (i.e., a substrate table) for accommodating a substrate, and a second table (i.e., a measurement table) for accommodating measurement instruments for performing various measurements related to the exposure operation.

In an embodiment of a lithographic apparatus, which exploits a liquid supply system of the kind addressed above, and in which two (or more) tables or stages are provided, the liquid confinement system may use the upper surfaces of the two or more tables (i.e., the surfaces of the tables oriented substantially perpendicularly to an optical axis of the projection system and facing a direction opposite to a main direction of the exposure radiation in the projection system) and/or use the substrate accommodated at a specific one of the tables as a functional component in order to confine the immersion liquid.

A lithographic apparatus is known from U.S. Pat. No. 7,310,132 B1, incorporated in its entirety herein by reference. In U.S. Pat. No. 7,310,132 a lithographic apparatus is described including two substrate tables. Each substrate table is provided with a long stroke module and a short stroke module which forms part of the second positioner for moving the substrate. Furthermore, the known lithographic apparatus is provided with a swap bridge in the form of a movable member. U.S. Pat. No. 7,310,132 B1 describes two main embodiments of the known lithographic apparatus. In a first configuration the substrate tables are movable with respect to each other, and in a second configuration, the substrate tables are coupled via the swap bridge which is realized by bringing the top surfaces of the substrate stages together by using the movable member for a joint movement. Another movable member is disclosed in US 2010/0128241, incorporated in its entirety herein by reference.

SUMMARY

The swap bridge of U.S. Pat. No. 7,310,132 and the other movable member disclosed in US 2010/0128241 enable one of the tables to take the place of the other one of the tables underneath the projection system without any major loss of immersion liquid. In a reference frame that is stationary with respect to the tables while moving in unison, the liquid confinement system slides from one table to the other table via a swap bridge member (e.g., the swap bridge of U.S. Pat. No. 7,310,132 or the other movable member of US 2010/0128241).

It is desirable, for example, to provide a table with a swap bridge member. Desirably the swap bridge member is light and mechanically simple.

According to an aspect of the invention, there is provided an immersion lithographic apparatus. The immersion lithographic apparatus comprises: a projection system for supplying a patterned beam of radiation to a top surface of a substrate and via an immersion liquid accommodated between the projection system and the top surface of the substrate; a first table with a first planar surface and a second table with a second planar surface, the first planar surface and the second planar surface being substantially coplanar; and a liquid confinement system configured for spatially confining the immersion liquid to a volume with a first surface area. The first surface area is coplanar with the first planar surface and with the second planar surface. The first surface area is substantially smaller than a second surface area of the top surface of the substrate. A swap bridge member is attached to the first table. The swap bridge member has an upper surface that is substantially coplanar with the first planar surface and with the second planar surface. The upper surface of the swap bridge member is configured to serve as part of the liquid confinement system when the immersion liquid is being transferred from one of the first table and the second table to another one of the first table and the second table. The swap bridge member is configured to deform when the swap bridge member collides with the second table and to remain attached to the first table.

The swap bridge member in the immersion lithographic apparatus of the invention is configured to absorb the energy of an unintended collision between the first table and the second table by deforming, thus mitigating the risk of damaging the first table or the second table.

In an embodiment of the immersion lithographic apparatus, the swap bridge member is configured to deform elastically when the swap bridge member collides with the second table.

Accordingly, the swap bridge member in above embodiment does not sustain any damage and is not rendered inoperative in a collision.

In an embodiment of the immersion lithographic apparatus, the swap bridge member is configured to deform by bending in a direction away from an imaginary reference plane. The imaginary reference plane is located between, on the one hand, the projection system and, on the other hand, the first planar surface and the second planar surface. The imaginary reference plane is substantially perpendicular to an optical axis of the projection system, when the swap bridge member collides with the second table.

Accordingly, the swap bridge member is configured to bend away from the projection system, thus preventing any collision of the swap bridge member with a last lens-element of the projection system.

In an embodiment of the immersion lithographic apparatus, the swap bridge member has a proximal portion and a distal portion. The proximal portion is attached to the first table and accommodates the upper surface. The distal portion has a further upper surface facing the imaginary reference plane. The further upper surface is inclined in the direction away from the imaginary reference plane. The second table has a side surface that is shaped complementarily to the distal portion so as to guide the distal end moving in the direction away from the imaginary plane on collision of the distal portion with the side surface.

Accordingly, the complementarily shaped side surface of the second table assists in moving the distal portion of the swap bridge member away from the space above the first planar surface of the first table, the space accommodating the projection system.

In an embodiment of the immersion lithographic apparatus, a mechanical end stop is provided between the swap bridge member and the first table. The mechanical end stop is configured to prevent the swap bridge member, when the swap bridge member collides with the second table, from bending in a direction towards an imaginary reference plane that is located between, on the one hand, the projection system and, on the other hand, the first planar surface and the second planar surface, and that is substantially perpendicular to an optical axis of the projection system. Examples of such mechanical end-stop will be discussed further below.

In an embodiment of the immersion lithographic apparatus, the swap bridge has a first portion bound by the upper surface and a second portion bound by the upper surface. The first portion has a first thickness in a direction perpendicular to the upper surface. The second portion has a second thickness in the direction perpendicular to the upper surface. The first thickness is lower than the second thickness so as to cause the swap bridge member to deform mainly at the first portion.

As a result, the extent and location of deformation are at least partly controlled by a profile or shape of the first portion of the swap bridge member.

In an embodiment of the immersion lithographic apparatus, the swap bridge member is attached to the first table via an elastic fastening. The elastic fastening is configured to prevent a thermal deformation of the swap bridge member from mechanically affecting the first table.

Accordingly, deformation of the swap bridge member as a result of a varying thermal load is not propagated into the remainder of the first table. A variation in the thermal load on the swap bridge member occurs, e.g., as a result of the temporary presence of the immersion liquid at the swap bridge member. A varying thermal load causes thermal expansion or thermal contraction of the material of the swap bridge member. The elastic fastening sees to it that the thermal expansion or thermal contraction does not cause any strain in the remainder of the first table.

In an embodiment of the immersion lithographic apparatus, the first table comprises a long-stroke module and a short-stroke module. The short-stroke module is supported by, and movable relative to, the long-stroke module. The swap bridge member is attached to the short-stroke module.

In an embodiment of the immersion lithographic apparatus, the second table comprises at least one opening for connection to an under-pressure source for removing the immersion liquid from a gap between the swap bridge member and the second table.

Above embodiments of the invention seek to cover commercial exploitation of an immersion lithographic apparatus. The invention can also be commercially exploited as a component of such an immersion lithographic apparatus.

Accordingly, the invention also relates to a first table for use in an immersion lithographic apparatus of the invention, and to a second table for use in an immersion lithographic apparatus of the invention

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

An aspect of the invention relates to a table for use in an immersion lithographic apparatus, the table comprising: a first planar surface; and a swap bridge member defining an upper surface which extends from and is substantially coplanar with the first planar surface; wherein the swap bridge member is configured to deform when the swap bridge member collides with another object, while remaining attached to the table.

Figure 1:
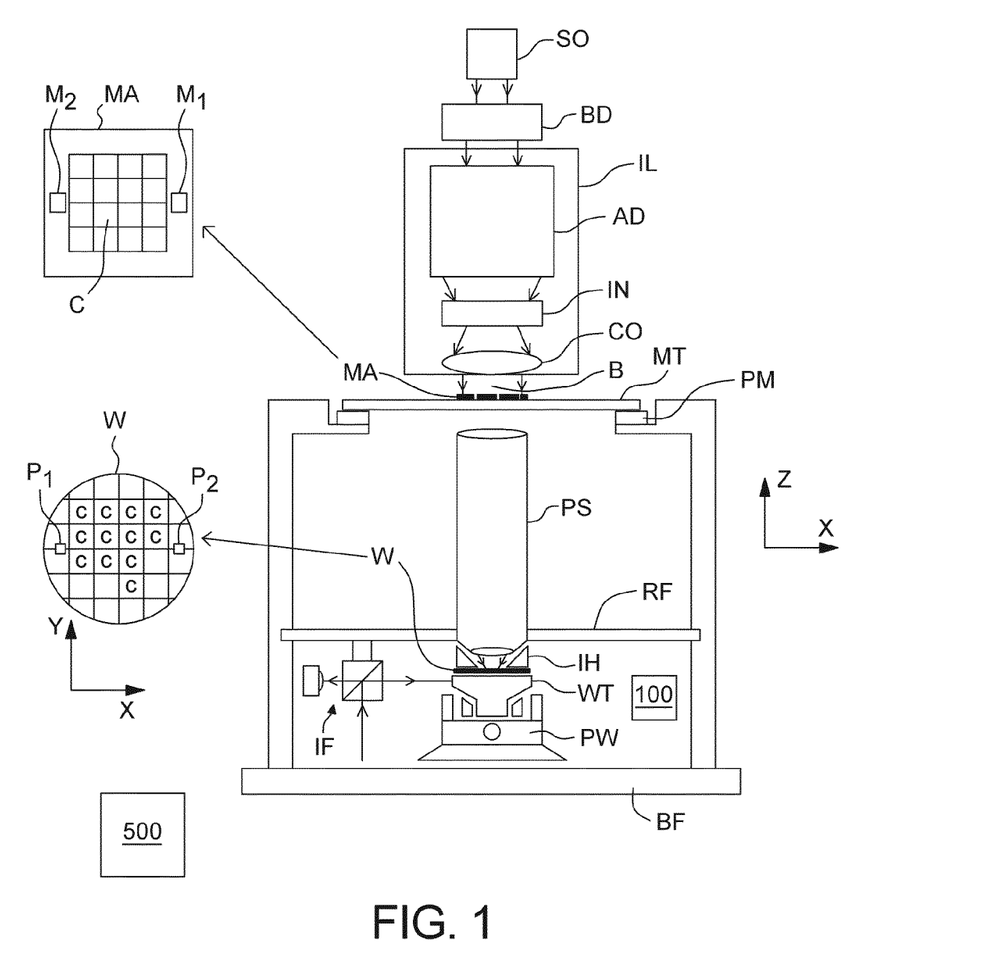
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation, DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The terms "projection system" used herein should be broadly interpreted as encompassing any type of system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more substrate support structures, such as substrate stages or substrate tables, and/or two or more support structures for patterning devices. In an apparatus with multiple substrate stages, all the substrate stages can be equivalent and interchangeable. In an embodiment, at least one of the multiple substrate stages is particularly adapted for exposure steps and at least one of the multiple substrate stages is particularly adapted for measurement or preparatory steps. In an embodiment of the invention one or more of the multiple substrate stages is replaced by a measurement stage. A measurement stage includes at least part one or more sensor systems such as a sensor detector and/or target of the sensor system but does not support a substrate. The measurement stage is positionable in the projection beam in place of a substrate stage or a support structure for a patterning device. In such apparatus the additional stages may be used in parallel, or preparatory steps may be carried out on one or more stages while one or more other stages are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. Substrate W is held on the substrate table WT by a substrate holder according to an embodiment of the present invention and described further below. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the volume filled with liquid remains substantially stationary relative to the projection system PS while the substrate W moves underneath that volume. FIGS. 2-5 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

Figure 2:
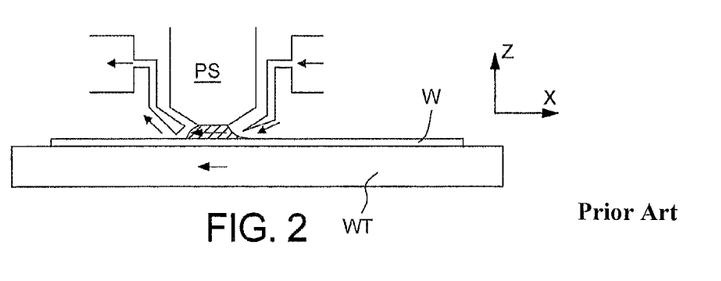
FIGS. 2 and 3 depict a liquid supply system for use in a lithographic projection apparatus.
Figure 3:
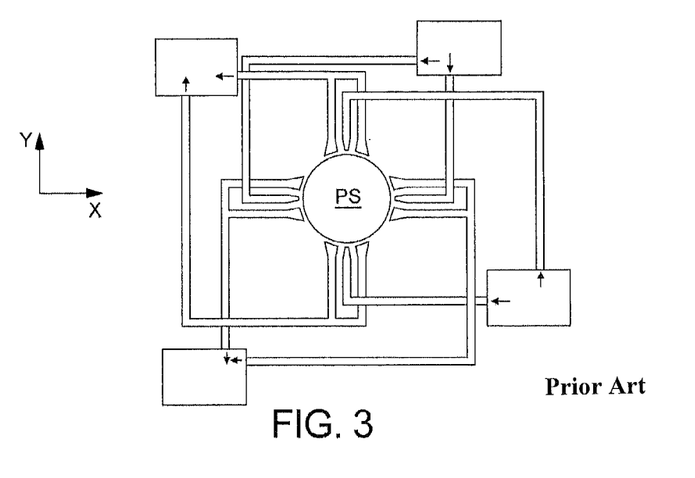

As illustrated in FIGS. 2 and 3, liquid is supplied by at least one inlet onto the substrate, preferably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. Various orientations and numbers of in- and outlets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
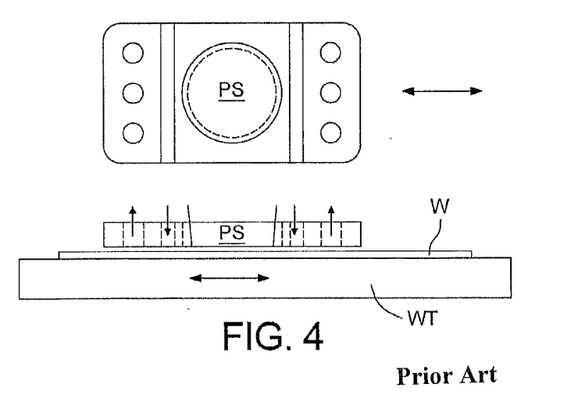
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate, substrate table or both. Such an arrangement is illustrated in FIG. 5.

Figure 5:
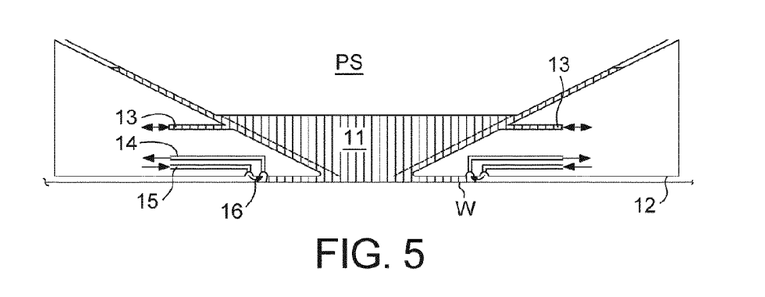
FIG. 5 depicts, in cross-section, a barrier member which may be used in an embodiment of the present invention as an immersion liquid supply system.

FIG. 5 schematically depicts a localized liquid supply system or fluid handling system with a liquid confinement structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) In an embodiment, a seal is formed between the liquid confinement structure 12 and the surface of the substrate W and which may be a contactless seal such as a gas seal (such a system with a gas seal is disclosed in European patent application publication no. EP-A-1,420,298) or a liquid seal.

The liquid confinement structure 12 at least partly contains liquid in the space 11 between a final element of the projection system PS and the substrate W. The space 11 is at least partly formed by the liquid confinement structure 12 positioned below and surrounding the final element of the projection system PS. Liquid is brought into the space below the projection system PS and within the liquid confinement structure 12 by liquid inlet 13. The liquid may be removed by liquid outlet 13.

The liquid may be contained in the space 11 by a gas seal 16 which, during use, is formed between the bottom of the barrier member 12 and the surface of the substrate W. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. Such a system is disclosed in United States patent application publication no. US 2004-0207824, which is hereby incorporated by reference in its entirety. In an embodiment, the liquid confinement structure 12 does not have a gas seal.

The present invention may be applied to any fluid handling structure including those disclosed, for example, in US 2006-0158627, US 2006-0038968, US 2008-0212046, US 2009-0279060, US 2009-0279062, US 2004-0207824, U.S. 61/181,158 filed 26 May 2009 and U.S. Ser. No. 61/394,184 filed on 18 Oct. 2010 the contents of all of which are hereby incorporated in their entirety by reference.

A control system 500 shown in FIG. 1 controls the overall operations of the lithographic apparatus. Control system 500 can be embodied as a suitably-programmed general purpose computer comprising a central processing unit and volatile and non-volatile storage. Optionally, the control system may further comprise one or more input and output devices such as a keyboard and screen, one or more network connections and/or one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The control system 500 may also be configured to control one or more associated process devices and substrate handling devices in a lithocell or cluster of which the lithographic apparatus forms a part. The control system 500 can also be configured to be subordinate to a supervisory control system of a lithocell or cluster and/or an overall control system of a fab.

The present invention is particularly suited to use with localized area type liquid supply systems such as those illustrated in FIGS. 2-5. There may be other liquid supply systems which are suitable. However, those types which provide liquid to only a localized area of the top surface of the substrate table and/or substrate and/or other object supported by the substrate table are most suited to the present invention.

A particular difficulty with immersion lithography is the swapping of substrates underneath the projection system PS. One method of doing this is to remove liquid from the liquid supply system and then to re-position a fresh substrate (and substrate table or a fresh substrate with the previous substrate table) under the projection system PS before reactivating the liquid supply system. However, during removal of all of the liquid from the liquid supply system, drying stains can appear on the final element of the projection system.

In order to address this it has been proposed to place a dummy substrate under the projection system PS during substrate swap so that the liquid supply system can continue to be full of liquid during substrate swap. In this method a dummy substrate might be supported by the substrate table and after the substrate of that substrate table has been imaged, the substrate table is moved such that the dummy substrate is positioned under the projection system PS and the dummy substrate is then somehow attached to the projection system PS. The substrate table can then be moved away and a new substrate loaded or a different substrate table with a new substrate can be moved into position under the projection system PS. The dummy substrate is then lowered onto the substrate table and then the substrate table moved such that the substrate is positioned under the projection system PS. In this way it is not necessary to empty the liquid supply system during substrate swap. However, this system requires a certain amount of time to affect substrate swap.

Figure 6:
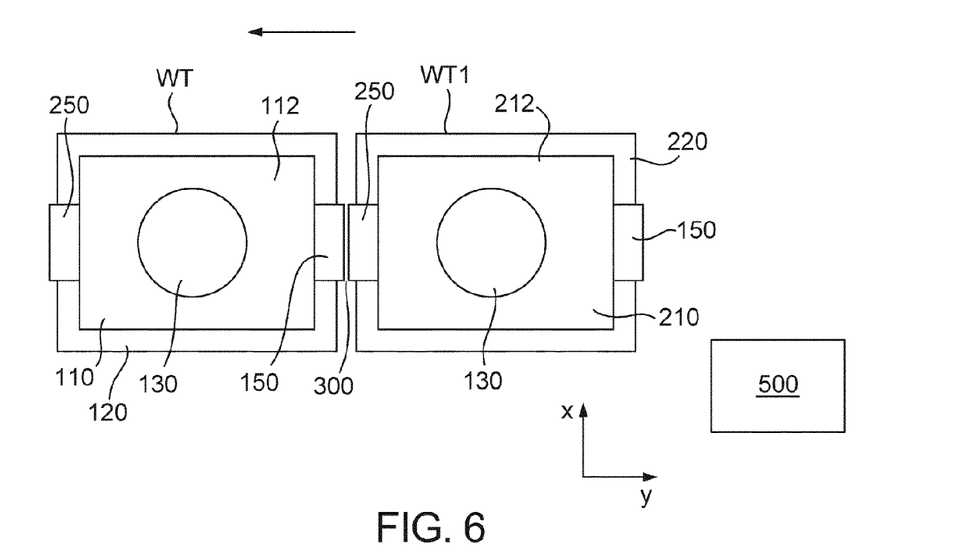
FIG. 6 depicts in plan, a substrate table and a further substrate table according to an embodiment of the invention.

An embodiment of the present invention is illustrated in FIG. 6 and uses the system where substrate swap is achieved by positioning a further substrate table WT1 next to the substrate table WT presently in use and ensuring that upper planar surfaces 112, 212 of both substrate tables WT, WT1 are substantially in the same plane. This is so that the liquid supply system can efficiently maintain the liquid in the desired space without leaking. If the (upper) planar surfaces 112, 212 of the substrate tables WT, WT1 are close enough together, it is possible to move the substrate tables WT, WT1 together under the projection system PS without leaking (or only minimal leaking) of liquid from the space through any gap 300 which might be present between the two planar 112, 212 surfaces of the substrate tables WT, WT1. An evacuation system or a drain may be provided between the substrate tables WT, WT1 such that any water which does leak between the gap 300 between the planar 112, 212 surfaces of the substrate tables WT, WT1 can be collected. In this way, throughput can be increased because this method of substrate swap is faster than the other two methods described above. Each substrate table WT, WT1 comprises a substrate holder 130, 230 for holding a substrate with a top surface substantially co-planar with the planar surface 112, 212. The invention is equally applicable to other tables used in an immersion lithographic apparatus, such as a measurement table.

In a lithographic apparatus it is desirable to protect the system from any damage in the case of a control system crash or power failure. For this reason substrate tables WT, WT1 are provided with a protection device (e.g. a bumper) which provides a protection zone which surrounds the substrate tables WT, WT1 and which is arranged in size and in shape to protect the substrate table WT, WT1 in the event of a crash by not allowing other objects to enter the protection zone (e.g. by providing a surface which will take any impact during a collision of the substrate tables WT, WT1 with one another or another object).

The presence of bumpers means that the substrate tables WT, WT1 cannot get close enough to one another such that their planar top surfaces 112, 212 are close enough together such that liquid from the liquid supply system will not fall into the gap 300 between the two planar surfaces 112, 212. For this purpose a swap bridge member 150 is provided attached to one of the substrate tables WT.

The swap bridge member 150 defines an upper surface 152 (FIG. 7) which is substantially co-planar with the planar surface 112 of the substrate table WT to which the swap bridge member 150 is attached. Therefore, the upper surface 152 of the swap bridge member 150 can be seen as an extension of the planar surface 112 of the substrate table WT. In this way, as the substrate table WT moves under the liquid supply system, the immersion liquid will be held in the liquid supply system by which ever member is underneath it, be it the top surface of the substrate W, the planar surface 112 of the substrate table (or a sensor or another object which has a top surface co-planar with the planar surface 112) or the upper surface 152 of the swap bridge member 150.

The swap bridge member 150 is wide enough (in the x direction as illustrated in FIG. 6) so that the liquid supply system can travel over it and the whole of the localized area to which the liquid supply member provides liquid is blocked by the upper surface 152 of the swap bridge member 150.

In an embodiment, the further substrate table WT1 is provided with an edge member 250. The edge member 250 may or may not extend beyond the planar surface 212 of the further substrate table WT1.

In an embodiment, each substrate table WT, WT1 has a swap bridge member 150 and an edge member 250 on opposite sides, as illustrated in FIG. 6.

Due to the upper surface 152 of the swap bridge member 150 extending over the footprint (including any bumper) of the substrate table WT, it is possible that a gap 300 between the upper surface 152 of the swap bridge member 150 and an upper surface of the edge member 250 is small enough that any loss of immersion liquid into that gap 300 from the liquid supply system can be dealt with.

In an embodiment the swap bridge member 150 is configured to deform when the swap bridge member 150 collides with another object (for example the edge member 250 of the further substrate table WT1). This has the advantage of not damaging either substrate table WT, WT1 which may be harder and/or more expensive to repair or replace than the swap bridge member 150. In an embodiment the swap bridge member 150 is configured to deform by bending. This has the advantage of simplicity of design. In an embodiment the swap bridge member 150 is configured to deform elastically. This has the advantage of the swap bridge member 150 being reusable after deformation in a crash.

In an embodiment, the upper surface 152 of the swap bridge member 150 is defined by a unitary body. In use, the upper surface 152 is planar. In an embodiment, when the swap bridge member 150 deforms, the upper surface 152 deforms so that it is no longer planar, but is, for example, curved.

Figure 7:
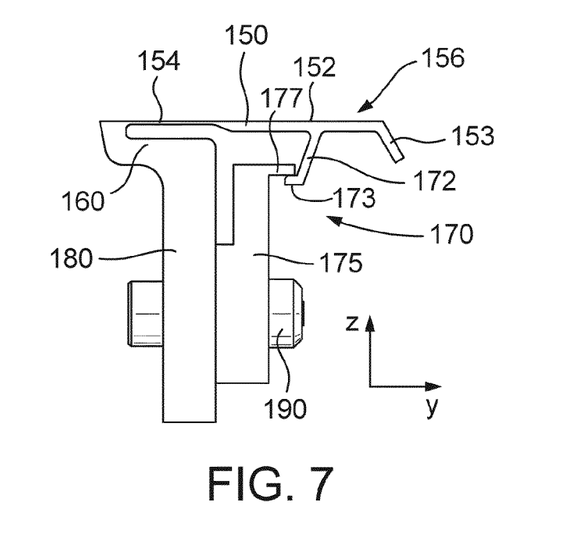
FIG. 7 illustrates, in cross-section, a swap bridge member according to an embodiment of the invention.

The swap bridge member 150 will now be described with reference to FIG. 7. FIG. 7 is a depiction of the swap bridge member 150 in cross-section.

Figure 9:
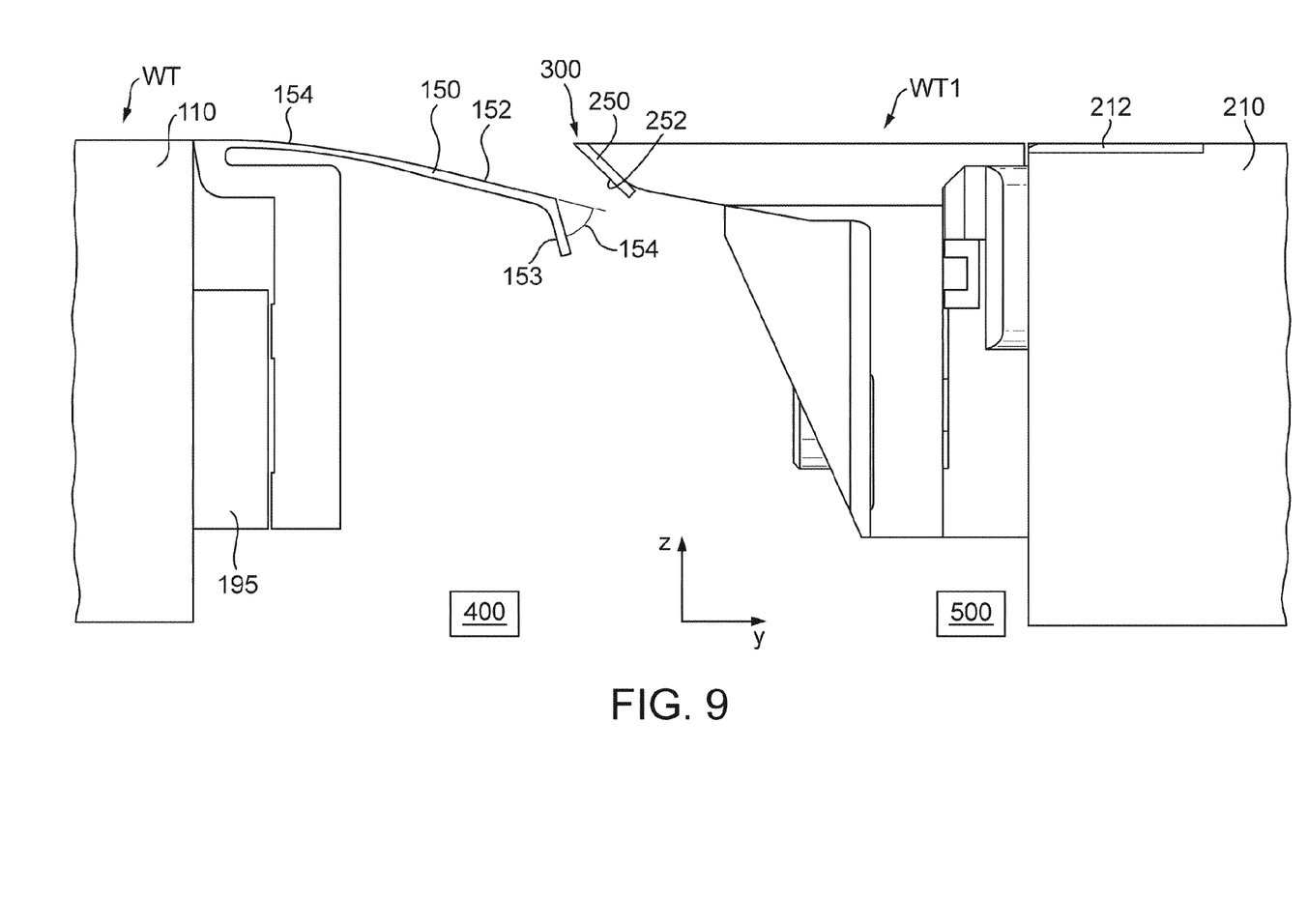
FIG. 9 illustrates, in plan, how the swap bridge member of a substrate table interacts with an edge of a further substrate table according to an embodiment of the invention.
Figure 12:
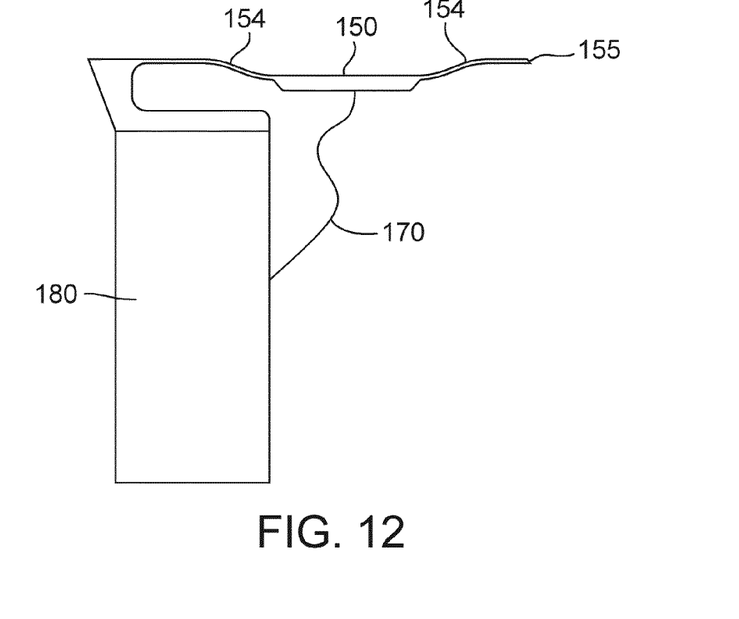

The swap bridge member 150 has an upper surface 152 which is configured to be co-planar with the planar surface 112 of the substrate table WT and the planar surface 212 of the further substrate table WT1. The swap bridge member 150 is relatively thin so that it deforms, preferably by bending, when the swap bridge member 150 collides with another object. In an embodiment, the shape in which the swap bridge member 150 is deformed as illustrated in FIG. 9. An alternative embodiment deforms as illustrated in FIG. 12.

Figure 8:
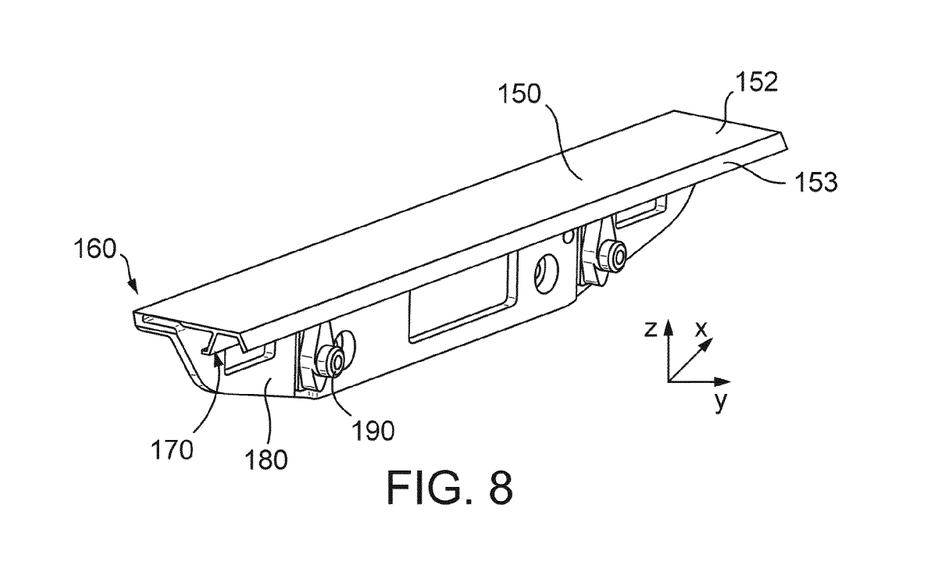
FIG. 8 illustrates, in perspective view, the swap bridge member of FIG. 7.

In an embodiment the swap bridge member 150 is part of a member 160 machined from a block of solid material. The material is machined or formed to form the swap bridge member 150 with the upper surface 152. At one end of the member 160, which is to be closest to the substrate holder 130 of the substrate table WT, there is a u-shape, in cross-section. The member 160 is mounted by a mount portion 180 (FIG. 9) not forming part of the swap bridge member 150 which defines the upper surface 152. The mount portion 180 is connected to the swap bridge member 150 via the above mentioned u-shape. The mount portion 180 is attached, for example through bolts 190, to the substrate table WT via a support 195. The mount 180 may comprise lightening holes, such as illustrated in FIG. 8.

In an embodiment, the swap bridge member 150 deforms by way of bending, preferably resulting in movement of a distal end (relative to the substrate holder 130) of the swap bridge member 150 downwards. In an embodiment the swap bridge member 150 comprises a tip portion 153. The tip portion 153 is at a distal end of the swap bridge member 150. The tip portion 153 is the part of the swap bridge member 150 furthest from the substrate holder 130. The tip portion 153 has a downwards inclined surface relative to the upper surface 152 of the swap bridge member 150. The purpose of the downwards inclined surface of the tip portion 153 will be described below with reference to FIG. 9.

It is desirable that when the swap bridge member 150 deforms, it is deflected downwards, rather than upwards. If the swap bridge member 150 (or parts of it) are deflected upwards, there is a chance of collision between the swap bridge member 150 and the liquid supply system, or worse, parts of the projection system PS. Measures which can be taken to ensure the swap bridge member 150 does not deform upwards will now be described.

In an embodiment a mechanical end stop 170 is provided. In an embodiment the mechanical end stop 170 resists deformation of the swap bridge member 150 upwards. In an embodiment, the mechanical end stop 170 is arranged such that it does not prevent the swap bridge member 150 from deflecting downwards. In the embodiment of FIG. 7 at least a part of the mechanical end stop 170 is attached to the swap bridge member 150 and at least a part of the mechanical end stop 170 is attached to the mount portion 180. The mount portion 180 is used to attach the swap bridge member 150 to the substrate table WT.

In an embodiment, the mechanical end stop 170 comprises two members. A first member 172 is attached to the underside of the swap bridge member 150. A second member 175 is attached to the mount 180. A first projection 173 on the first member 172 and a second projection 177 on the second member 175 mechanically interlock to prevent upward deformation of the swap bridge member 150. However, the projections 173, 177 do not prevent downward deformation of the swap bridge member 150. Therefore, the swap bridge member 150 is prevented from deflecting upwards but is free to deflect downwards.

In an embodiment, the substrate table WT is provided with a short stroke module 110 which is supported by and moves relative to a long stroke module 120. The long stroke module 120 moves relative to the remainder of the lithographic apparatus. The long stroke module 120 is for making relatively large movements of the substrate table WT. The short stroke module 110 is for making rather fine adjustments of the position of the substrate W (or other objects mounted on the short stroke module 110) relative to the projection system PS.

Due to the light weight design of the swap bridge member 150 and the lack of complexity, the swap bridge member 150 and its related assembly (member 160 and mount 180) is relatively light. The lightness of the swap bridge member 150 and the lack of moving parts allows it, in an embodiment, to be mounted to the short stroke part 110 of the substrate table WT.

In an embodiment the swap bridge member 150 is at least partly mechanically isolated from other parts of the substrate table WT. In an embodiment the mechanical isolation is achieved by an elastic fastening. An elastic fastening is used for attaching the swap bridge member 150 to other parts of the substrate table WT (for example the short stroke part 110). In an embodiment the elastic fastening comprises at least one leaf spring. The use of an elastic fastening has the advantage that any thermal deformations of the swap bridge member 150 are not transmitted to the substrate table WT. In an embodiment, the elastic fastening is part of the support 195.

FIG. 8 is a perspective view of the swap bridge member 150 and associated mount 180. As can be seen, the first member 172 of the mechanical end stop 170 is provided continuously along the elongate width (in the x direction) of the swap bridge member 150. This need not be the case. However, it may be easier to form the first member 172 along the entire width of the swap bridge member 150 if, for example, the swap bridge member 150 is machined by wire cutting or by extrusion, for example. In an embodiment, the second member 175 of the end stop 170 is only provided at discrete locations, for example one or two or more discrete positions along the width of the swap bridge member 150.

When a liquid supply system passes over the swap bridge member 150, there may be attractive forces attracting the swap bridge member 150 upwards at certain times and there may be repulsive forces pushing the swap bridge member 150 downwards at certain times. It is desirable to limit the amount of movement of the swap bridge member 150 in the z direction due to forces between it and the liquid supply system. In order to achieve this, in one embodiment, the swap bridge member 150 is manufactured with a upward pre-bend. The upward pre-bend may, for example, be of the order of 40-80 µm at the tip portion 153 compared to the portion closest to the substrate holder 130. The mechanical end stop 170 corrects for this pre-bend and leaves the swap bridge member 150 without an upward deflection. That is, the upper surface 152 is planar. As a result, repulsive forces between the swap bridge member 150 and the liquid supply system need to overcome the biasing force resulting from the pre-bend before they are enough to deflect the swap bridge member 150 downwards. Additionally, any attractive force between the swap bridge member 150 and the liquid supply system will be counteracted by the mechanical end stop 170. In an embodiment the swap bridge member 150 is deformed elastically downwards so that the upper surface 152 is substantially co-planar with the planar surface 112 of the substrate table.

In an embodiment the thickness (in a direction perpendicular to the upper surface 152) of the swap bridge member 150 is varied. In an embodiment the variation in thickness is in the y direction, namely the direction such that thick and thin portions are different distances from the substrate holder 130. References to positions relative to the substrate holder 130 can be read as distances relative to the remainder of the table, particularly for the case where the table is not a substrate table.

As can be seen in FIG. 7, the swap bridge member 150 is provided with portions which are relatively thin 154 and portions which are relatively thicker 156. The location of the thick and thin portions 156, 154 of the swap bridge member 150 can be chosen to ensure that the swap bridge member 150 bends in the correct direction on collision. For example, in the embodiment of FIG. 7, the thin portion 154 is provided closer to the substrate holder 130 than the thicker portion 156. This results in any bending of the swap bridge member 150 being at the thin portion 154 i.e. at a location proximate to the substrate holder 130. An advantage of the thicker portion 156 is that it is easier to ensure that the corresponding portion of the upper surface 152 is flat.

Other variations in thickness may be desirable, depending upon the type of deformation required. In an embodiment a thick portion of the swap bridge member 150 is of the order of 0.2 mm thick whereas a thick portion is of the order of 0.6 mm.

In an embodiment the swap bridge member 150 is made of a metal, for example stainless steel or titanium. Titanium is preferred because it is lighter than stainless steel. In an embodiment the thickness at the thin portion 154 is such that the stiffness of the swap bridge member 150, when a load is applied at the tip portion 153, is less than 100 N/mm, desirably less than 50 N/mm or more desirably less than 30 N/mm or even more desirably less than 20 N/mm. In an embodiment the stiffness is at least 5 N/mm, desirably at least 10 N/mm. These values of stiffness mean that the swap bridge member 150 will not deform under the usual loads applied by a liquid handling system but will deform on collision, thereby preventing damage to components of the substrate table WT.

FIG. 9 illustrates a substrate table WT and a further substrate table WT1 following collision (though the two substrate tables WT, WT1 are illustrated further apart, for clarity). The further substrate table WT1 is provided with the edge member 250. The edge member 250 comprises a downwardly facing surface 252. The downwardly facing surface 252 is inclined relative to the upper surface 152 of the swap bridge member 150. The angle of incline is substantially the same as the angle of incline of the tip portion 153. When the substrate table WT and further substrate table WT1 are brought too close to each other the upper surface of the tip portion 153 will contact the downwardly facing surface 252 of the edge member 250. In an embodiment, as a result of a collision, the swap bridge member 150 is forced to deform due to the interaction of the tip portion 153 and edge member 250. This allows the substrate table WT and substrate table WT1 to be moved closer to each other without damage than would be the case if the swap bridge member 150 was not deformable. In an embodiment, the angle of inclination is chosen such that the two surfaces will slide relative to one another and force the swap bridge member 150 to deform, for example to bend at the thin portion 154. In an embodiment, as the swap bridge member 150 is deformable elastically, no damage at all results from a collision between the substrate table WT and the further substrate table WT1.

In an embodiment, a suitable angle of inclination downwards of the outer surface of the tip portion 153 relative to the upper surface 152 (angle 154) is between 30 and 75°, preferably between 40 and 65°.

In an embodiment, due to the interaction of the tip portion 153 and the edge member 250, the swap bridge member 150 is configured to be deformed and move under the second planar surface 212 when the substrate table WT and further substrate table WT1 collide.

The edge member 250 and tip portion 153 at the distal end of the swap bridge member 150 are complimentary shaped such that on collision of the edge member 250 with the distal end, the swap bridge member 150 deforms so as to allow the substrate table WT and further substrate table WT1 to move closer together. Of course there is a limit to the closeness the substrate table WT and further substrate table WT1 can achieve prior to permanent damage occurring. Therefore, in an embodiment a sensor 400 is provided for detecting a collision between the substrate table WT and substrate table WT1. In an embodiment the detector 400 is a strain gage which detects deformation of the swap bridge member 150. In an embodiment the detector 400 is a (part of the) position measurement system which measures the position of the substrate table WT and further substrate table WT1 and determines from their respective positions the closeness of the substrate table WT and substrate table WT1 and thereby whether or not collision has occurred. In an embodiment, a level sensor may be used to check the upper surface 152 after a crash. In an embodiment software monitoring may be used to monitor power supply, software, motors etc. for failure. If failure occurs the controls are set to separate the substrate tables WT, WT1 and limit the collision length.

In an embodiment, a signal from the detector 400 indicative of a collision is sent to controller 500. On receipt of such a signal, the controller 500 stops the substrate table WT and substrate table WT1 from moving closer together than a predetermined minimum distance. In an embodiment the controller 500 prevents power from being supplied to positioning means of the substrate table WT and/or substrate table WT1 on receipt of a signal from the detector 400 indicative that a collision has occurred.

An advantage of providing the swap bridge member 150 as a deformable member is that the swap bridge member 150 may have a continuous upper surface 152 without any gaps. The swap bridge member 150 may be mounted in contact with, or very close to the planar surface 112 of the substrate table WT. This contrasts the situation where a hinge is provided between the substrate table WT and a stiff swap bridge member 150 which does not deform. Additionally, it is mechanically very difficult to provide a hinge which does not protrude above the planar surface 112 or upper surface 152. The absence of a gap is advantageous as a gap disadvantageously potentially allows immersion liquid into it or gas to escape from the gap and thereby to cause bubbles in immersion liquid which can lead to imaging defects.

The swap bridge member 150 (and member 160 as a whole) may be manufactured by wire erosion. During wire erosion of the thin portion 154 a pre-bend of the swap bridge member 150 can be naturally induced.

An advantage of the swap bridge member 150 of the present invention is that the short stroke parts 110, 210 of the substrate table WT and further substrate table WT1 do not touch each other. Therefore, transfer of disturbance forces between the short stroke parts 110, 210 does not occur.

Figure 10:
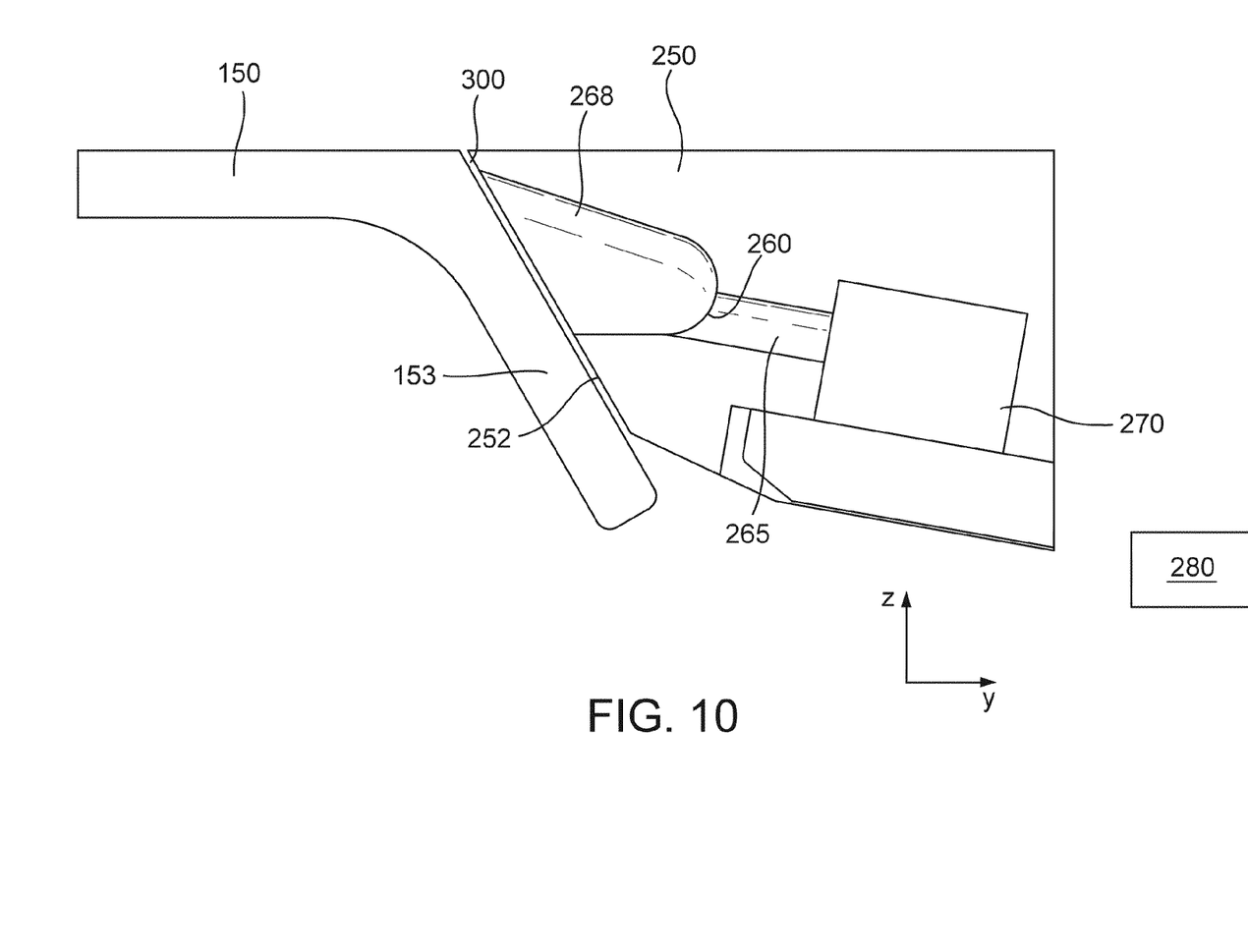
FIG. 10 illustrates, in cross-section, the detail of a distal end of a swap bridge member according to an embodiment of the invention and an edge of a further substrate table;]

In an embodiment a gap 300 between the tip end portion 153 and edge member 150 exists even when the substrate table WT and further substrate table WT1 are moving in tandem together under the projection system PS. In an embodiment the size of the gap is of the order of several tens of μm, for example about 50 μm or 100 μm. Therefore, liquid may penetrate into that gap 300. FIG. 10 illustrates how any such immersion liquid is removed. In the downwardly inclined surface 252 of the edge member 250, a plurality of openings 260 are provided in a groove 268. The groove 268 extends along the width (x direction) of the edge member 250. The openings 260 are connected (via a channel 265) to a chamber 270. The chamber 270 is held at an under pressure (it is connected to an under pressure source 280). Thereby any liquid which finds itself in the gap 300 is removed through the openings 260. A plurality of openings 260 may be provided. The openings 260 may be in a one dimensional or two dimensional array arranged along the width of the edge member 250.

Figure 11:
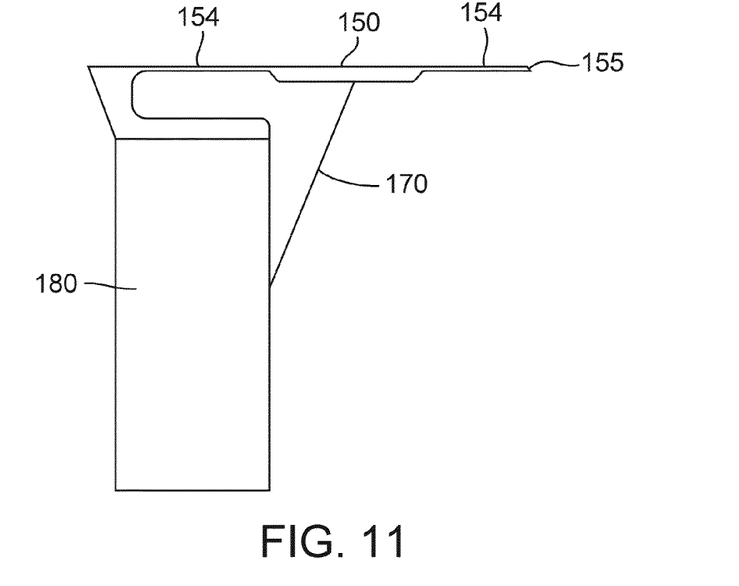
FIGS. 11 and 12 illustrate, in cross-section, a swap bridge member according to an embodiment of the invention.

FIGS. 11 and 12 illustrate a further embodiment of a swap bridge member 150 according to the present invention. The swap bridge member 150 of FIGS. 11 and 12 is the same as the swap bridge member 150 of FIGS. 7-10 except as described below.

There are three main differences in the swap bridge member 150 of FIGS. 11 and 12 compared with the embodiment of FIGS. 7-10. The first difference is that the swap bridge member 150 is provided with relatively thin portions 154 at proximal and distal ends of the swap bridge member 150. As can be seen from FIG. 12, when a compressive force is applied to the swap bridge member 150 (due to a collision), the swap bridge member 150 buckles by bending at the two relatively thin portions 154. It is ensured that the buckling occurs in the downwards direction by the mechanical end stop 170.

The second difference is that in the embodiment of FIGS. 11 and 12 mechanical end stop 170 is comprised of a single relatively flexible member. The member is attached to the swap bridge member 150 and also to another part, for example the mount 180, of the substrate table WT. When in tension in the normal position (in an embodiment counteracting the pre-bend of the swap bridge member 150), the mechanical end stop 170 resists movement of the swap bridge member 150 upwards. During collision, the mechanical end stop 170 may shorten its length (because it is flexible) thereby allowing buckling of the swap bridge member 150 only in a direction downwards.

The third difference between the swap bridge member 150 of FIGS. 11 and 12 and that of FIGS. 7 to 10 is that the tip end portion is absent. Instead, the function of the tip end portion is provided by the surface 155 at the distal end of the swap bridge member 150. The surface 155 has an inclined angle, and operates in the same way as the tip portion 153 described above.

With reference to FIGS. 9 and 10, the swap bridge member 150 may comprise an electrically conductive material and, similarly, the edge member 250 may comprise the same electrically conductive material or another electrically conductive material. The swap bridge member 150 may be attached to a relevant one of the substrate table WT and the substrate table WT1 so as to be electrically isolated therefrom. Similarly, the edge member 250 may be attached to the other relevant one of the substrate table WT and the substrate table WT1 so as to be electrically isolated therefrom. Accordingly, in such a configuration, the swap bridge member 150 and the edge member 250 can be used as plates of a capacitor. The capacitor has a capacitance that depends on, among other things, a relative position of the swap bridge member 150 and the edge member 250. In other words, the capacitance can be used to determine how well the swap bridge member 150 and the edge member 250 are aligned. A measured magnitude of the capacitance can be verified against a reference, determined in advance, for indicating how well the swap bridge member 150 and the edge member 250 are aligned and how close the swap bridge member 150 and the edge member 250 are positioned. For example, consider a scenario wherein the substrate table WT and the substrate table WT1 are being moved towards each other in any of the x-direction, y-direction and z-direction in order to be able to reposition the liquid confinement structure 12 from above one of the substrate table WT and the substrate table WT1 to above the other one of the substrate table WT and the substrate table WT1. When the substrate table WT and the substrate table WT1 are being moved towards each other, the measuring of the magnitude of capacitance is started. During the relative movement of the substrate table WT and the substrate table WT1, the measured magnitude of the capacitance changes. Accordingly, repeatedly measuring the magnitude of the capacitance while the substrate table WT and the substrate table WT1 are moving towards each other generates a sequence of measured magnitudes. Each individual one of the measured magnitudes is representative of a degree of alignment of the swap bridge member 150 at the moment of generating the individual measured magnitude. Each individual measured magnitude is representative of a distance between the swap bridge member 150 and the edge member 250 at the moment of generating the individual measured magnitude. Each individual measured magnitude is compared with the pre-determined reference. When the most recently generated individual measurement equals or otherwise matches the reference the relative movement is stopped.

The edge member 250 has the downwardly facing surface 252. The downwardly facing surface 252 faces an upwardly facing surface of the tip portion 153 of the swap bridge member 150 when the swap bridge member 150 and the edge member 250 are aligned. Preferably, the downwardly facing surface 252 and the upwardly facing surface have a hydrophobic coating so as to repel any droplet of the immersion liquid that inadvertently has found its way to the downwardly facing surface 252 or to the upwardly facing surface in a previously executed repositioning of the liquid confinement structure 12. The presence of such droplet while aligning the swap bridge member 150 and the edge member 250 may affect the measured magnitude of the capacitance.

While the swap bridge member 150 and the edge member 250 are being moved towards each other for repositioning the liquid confinement structure 12, the repeated measuring of the magnitude of the capacitance may be used to detect an impending collision of the substrate table WT and the substrate table WT1, in order to prevent the collision from occurring.

As discussed above, in a particular embodiment, the swap bridge member 150 is configured to deform elastically when inadvertently contacting, e.g., the edge member 250. However, the swap bridge member 150 has a mass and, therefore, inertia. Accelerating or decelerating the substrate table to which the swap bridge member 150 is attached may give rise to elastic deformation of the swap bridge member 150, owing to the inertia of, e.g., the tip portion 153. This inertia-induced deformation may affect the measured magnitude of the capacitance while the substrate table is moving to which the swap bridge member 150 is attached.

The inertia-induced deformation can be treated as an offset in the measured magnitude of the capacitance. The offset depends on the mass of the part of the swap bridge member 150 that will undergo the inertia-induced deformation and on the magnitude of the acceleration or deceleration. The part of the swap bridge member 150 that will undergo the inertia-induced deformation comprises, for example, the tip portion 153. The inertia-induced deformation is then a change of the orientation of the tip portion 153 relative to the rest of the swap bridge member. The force on the deforming part of the swap bridge member 150 is then the product of the mass of the tip portion 153 and the acceleration (or deceleration). The estimated offset is then the ratio of the force and the stiffness of the section of the swap bridge member 150 that connects the tip portion 153 to the rest of the swap bridge member.

Accordingly, an immersion lithographic apparatus in an embodiment of the invention may have following features. The tip portion 153 (distal portion or distal end) comprises an electrically conductive material, optionally coated with a hydrophobic coating. The downwardly facing surface 252 of the edge member 250 comprises a further portion of a same or another electrically conductive material at the side surface 252, or underneath the side surface 252 if a hydrophobic coating is applied to the side surface 252. At least one of the substrate table WT and the substrate table WT1 comprises a measuring system for measuring an electrical capacitance of a capacitor formed by the distal portion and the further portion.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention, at least in the form of a method of operation of an apparatus as herein described, may be practiced otherwise than as described. For example, the embodiments of the invention, at least in the form of a method of operation of an apparatus, may take the form of one or more computer programs containing one or more sequences of machine-readable instructions describing a method of operating an apparatus as discussed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing and sending signals. One or more multiple processors are configured to communicate with at least one of the controllers. For example, each controller may include one or more processors for executing the computer programs that include machine-readable instructions for the methods of operating an apparatus as described above. The controllers may include data storage media for storing such computer programs, and/or hardware to receive such media. So the controller(s) may operate according to the machine readable instructions of one or more computer programs.

An embodiment of the invention may be applied to substrates with a width (e.g., diameter) of 300 mm or 450 mm or any other size.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

What is claimed is:

1. An immersion lithographic apparatus comprising:
   a projection system for supplying a patterned beam of radiation to a top surface of a substrate and via an immersion liquid accommodated between the projection system and the top surface of the substrate;
   a first table with a first planar surface and a second table with a second planar surface, the first planar surface and the second planar surface being substantially coplanar;
   a liquid confinement system configured to spatially confine the immersion liquid to a volume with a first surface area, wherein the first surface area is coplanar with the first planar surface and with the second planar surface, and is substantially smaller than a second surface area of the top surface of the substrate, and
   a swap bridge member attached to the first table, the swap bridge member having an upper surface that is substantially coplanar with the first planar surface and with the second planar surface;
   wherein the upper surface of the swap bridge member is configured to serve as part of the liquid confinement system when the immersion liquid is being transferred from one of the first table and the second table to another one of the first table and the second table,
   wherein the swap bridge member is configured to deform when the swap bridge member collides with the second table and to remain attached to the first table, and
   wherein the swap bridge member is configured to deform by bending in a direction away from an imaginary reference plane that is located between, on the one hand, the projection system and, on the other hand, the first planar surface and the second planar surface, and that is substantially perpendicular to an optical axis of the projection system, when the swap bridge member collides with the second table.

2. The immersion lithographic apparatus of claim 1, wherein the swap bridge member is configured to deform elastically when the swap bridge member collides with the second table.

3. The immersion lithographic apparatus of claim 1, wherein:
   the swap bridge member has a proximal portion and a distal portion,
   the proximal portion is attached to the first table and accommodates the upper surface,
   the distal portion has a further upper surface facing the imaginary reference plane and being inclined in the direction away from the imaginary reference plane, and
   the second table has a side surface that is shaped complementarily to the distal portion so as to guide the distal end moving in the direction away from the imaginary plane on collision of the distal portion with the side surface.

4. The immersion lithographic apparatus of claim 3, wherein:
   the distal portion comprises an electrically conductive material,
   the second table comprises a further portion of a further electrically conductive material at or underneath the side surface, and
   at least one of the first table and the second table comprises a measuring system for measuring an electrical capacitance of a capacitor formed by the distal portion and the further portion.

5. The immersion lithographic apparatus of claim 1, wherein a mechanical end stop is provided between the swap bridge member and the first table, the mechanical end stop configured to prevent the swap bridge member from bending in a direction towards the imaginary reference plane.

6. The immersion lithographic apparatus of claim 1, wherein the swap bridge has a first portion bound by the upper surface and a second portion bound by the upper surface, the first portion having a first thickness in a direction perpendicular to the upper surface and the second portion having a second thickness in the direction perpendicular to the upper surface, the first thickness lower than the second thickness so as to cause the swap bridge member to deform mainly at the first portion.

7. The immersion lithographic apparatus of claim 1, wherein the swap bridge member is attached to the first table via an elastic fastener, the elastic fastener configured to prevent a thermal deformation of the swap bridge member from mechanically affecting the first table.

8. The immersion lithographic apparatus of claim 1, wherein the first table comprises a long-stroke module and a short-stroke module, the short-stroke module supported by, and moveable relative to, the long-stroke module, and wherein the swap bridge member is attached to the short-stroke module.

9. The immersion lithographic apparatus of claim 1, wherein the second table comprises at least one opening for connection to an under-pressure source for removing the immersion liquid from a gap between the swap bridge member and the second table.

10. A first table for use in an immersion lithographic apparatus of claim 1.

11. A second table for use in an immersion lithographic apparatus of claim 3.

* * * * *